(12) United States Patent
Yang et al.

(10) Patent No.: US 11,221,507 B1
(45) Date of Patent: Jan. 11, 2022

(54) LIQUID CRYSTAL DISPLAY MOUNTING DEVICE

(71) Applicant: LITEMAX ELECTRONICS INC., New Taipei (TW)

(72) Inventors: Tien-Teng Yang, New Taipei (TW); Ling-Chi Lo, New Taipei (TW)

(73) Assignee: LITEMAX ELECTRONICS INC., New Taipei (TW)

( * ) Notice: Subject to any disclaimer, the term of this patent is extended or adjusted under 35 U.S.C. 154(b) by 0 days.

(21) Appl. No.: 17/197,066

(22) Filed: Mar. 10, 2021

(51) Int. Cl.
*G02F 1/1333* (2006.01)
*G02F 1/1345* (2006.01)
*H05K 5/00* (2006.01)

(52) U.S. Cl.
CPC .... *G02F 1/133308* (2013.01); *G02F 1/13452* (2013.01); *H05K 5/0017* (2013.01); *H05K 5/0021* (2013.01)

(58) Field of Classification Search
CPC .......... G02F 1/133308; G02F 1/13452; H05K 5/0017; H05K 5/0021
See application file for complete search history.

(56) References Cited

U.S. PATENT DOCUMENTS

2017/0181295 A1\* 6/2017 Gu ...................... H05K 5/0017

\* cited by examiner

*Primary Examiner* — Phu Vu

(57) ABSTRACT

A liquid crystal display mounting device for mounting a first liquid crystal display and a second liquid crystal display in place is introduced. The liquid crystal display mounting device includes a frame, first display mounting member, second display mounting member and mounting supporting unit. Thus, the positions of the frame, first display mounting member, second display mounting member and mounting supporting unit are subject to changes as needed, allowing the first liquid crystal display and second liquid crystal display to be hung on a wall, hung from a ceiling, or erected.

8 Claims, 3 Drawing Sheets

LIQUID CRYSTAL DISPLAY MOUNTING DEVICE

BACKGROUND OF THE INVENTION

1. Field of the Invention

The present disclosure relates to liquid crystal display mounting devices, and in particular to a liquid crystal display mounting device which can be hung on a wall, hung from a ceiling, or erected.

2. Description of the Related Art

A conventional dual display device typically includes a mounting frame and two liquid crystal displays coupled together by the mounting frame to achieve dual display.

The mounting frame of the conventional dual display device typically work in an invariable mounting direction. As a result, the mounting frame of the conventional dual display device must come in different (at least three) forms in order for the conventional dual display device to be hung on a wall, hung from a ceiling, or erected. Consequently, one single mounting frame is not sufficient to allow the conventional dual display device to be hung on a wall, hung from a ceiling, or erected.

BRIEF SUMMARY OF THE INVENTION

An objective of the present disclosure is to provide a liquid crystal display mounting device whose frame, first display mounting member, second display mounting member and mounting supporting unit can have their mounting positions changed so as for its first liquid crystal display and second liquid crystal display to be hung on a wall, hung from a ceiling, or erected.

To achieve at least the above objective, the present disclosure provides a liquid crystal display mounting device for mounting a first liquid crystal display and a second liquid crystal display in place, the liquid crystal display mounting device comprising a frame, a first display mounting member, a second display mounting member and a mounting supporting unit. The frame has a frame wiring dispensing portion. The first display mounting member is disposed in front of the frame. The first liquid crystal display is disposed at the first display mounting member. The second display mounting member is disposed at the rear of the frame. The second liquid crystal display is disposed at the second display mounting member. The mounting supporting unit comprises a first support member, a second support member and a mounting base. One end of the first support member is coupled to the first display mounting member. One end of the second support member is coupled to the second display mounting member. The other end of the first support member and the other end of the second support member are coupled to the mounting base. The mounting base has a mounting base wiring dispensing portion corresponding in position to the frame wiring dispensing portion. A conducting wire of the first liquid crystal display and a conducting wire of the second liquid crystal display extend from the frame wiring dispensing portion and the mounting base wiring dispensing portion and exit the frame.

Regarding the liquid crystal display mounting device, the frame further comprises a cover disposed at a front of the frame and enclosing a border of the first liquid crystal display.

Regarding the liquid crystal display mounting device, a front lamp strip is disposed between the cover and the frame, and a rear lamp strip is disposed at a rear of the frame, allowing the front lamp strip and the rear lamp strip to be electrically connected to the first liquid crystal display and the second liquid crystal display, respectively.

Regarding the liquid crystal display mounting device, the first display mounting member comprises a first central mounting portion and two first end mounting portions. The first end mounting portions are disposed at two ends of the first central mounting portion, respectively, the first end mounting portions being coupled to an inner edge of a front of the frame, the first central mounting portion being coupled to an end of the first support member, the first liquid crystal display being coupled to the first central mounting portion and the first end mounting portions.

Regarding the liquid crystal display mounting device, the second display mounting member comprises a second central mounting portion and two second end mounting portions. The second end mounting portions are disposed at two ends of the second central mounting portion, respectively. The second end mounting portions are coupled to the inner edge of the rear of the frame. One end of the second support member is coupled to the second central mounting portion. The second liquid crystal display is coupled to the second central mounting portion and the second end mounting portions.

Regarding the liquid crystal display mounting device, the first support member has a first connecting portion and a first fitting portion, the first connecting portion being disposed at an end of the first fitting portion and coupled to the first display mounting member, the first fitting portion being coupled to the mounting base.

Regarding the liquid crystal display mounting device, the second support member has a second connecting portion and a second fitting portion. The second connecting portion is disposed at one end of the second fitting portion. The second connecting portion is coupled to the second display mounting member. The second fitting portion is coupled to the mounting base.

Regarding the liquid crystal display mounting device, the mounting base has a catch portion and at least two fixedly connecting portions. The mounting base wiring dispensing portion is disposed at the catch portion. The fixedly connecting portions are disposed at two ends of the catch portion. The other end of the first support member and the other end of the second support member are coupled to the catch portion.

Therefore, the present disclosure provides a liquid crystal display mounting device whose frame, first display mounting member, second display mounting member and mounting supporting unit have their mounting positions subject to changes, so as for its first liquid crystal display and second liquid crystal display to be hung on a wall, hung from a ceiling, or erected.

DETAILED DESCRIPTION OF THE INVENTION

To facilitate understanding of the object, characteristics and effects of this present disclosure, embodiments together with the attached drawings for the detailed description of the present disclosure are provided.

Figure 1:
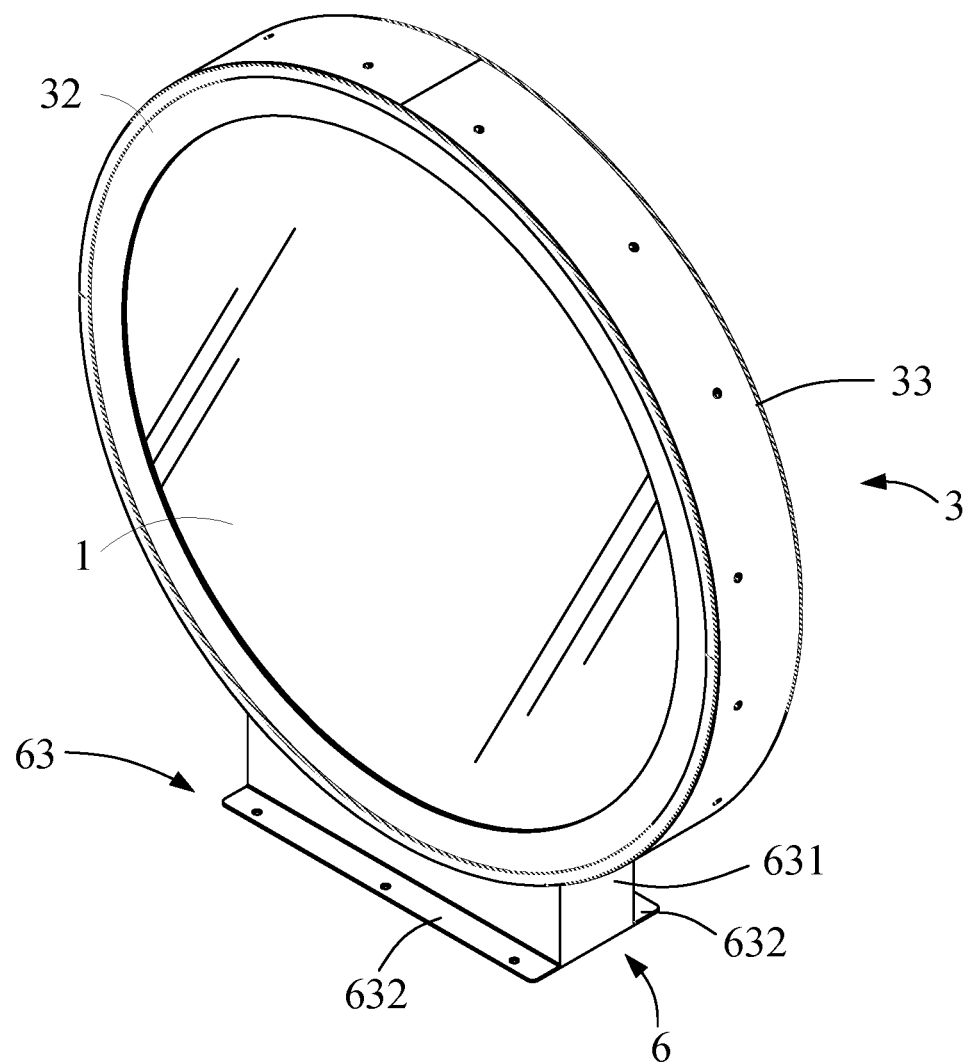
FIG. 1 is a perspective view of a liquid crystal display mounting device according to a preferred embodiment of the present disclosure.
Figure 2:
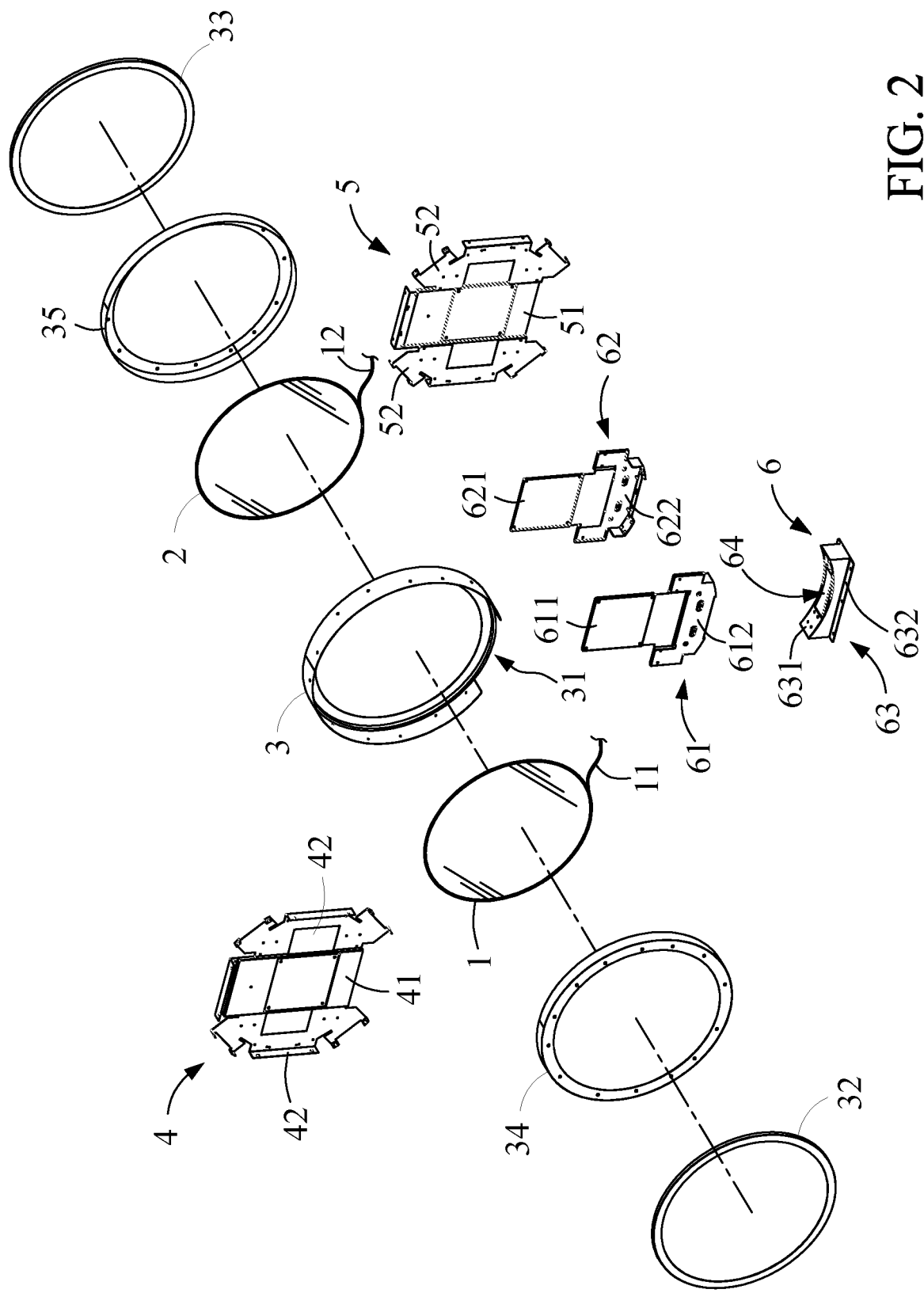
FIG. 2 is an exploded view of the liquid crystal display mounting device according to a preferred embodiment of the present disclosure.
Figure 3:
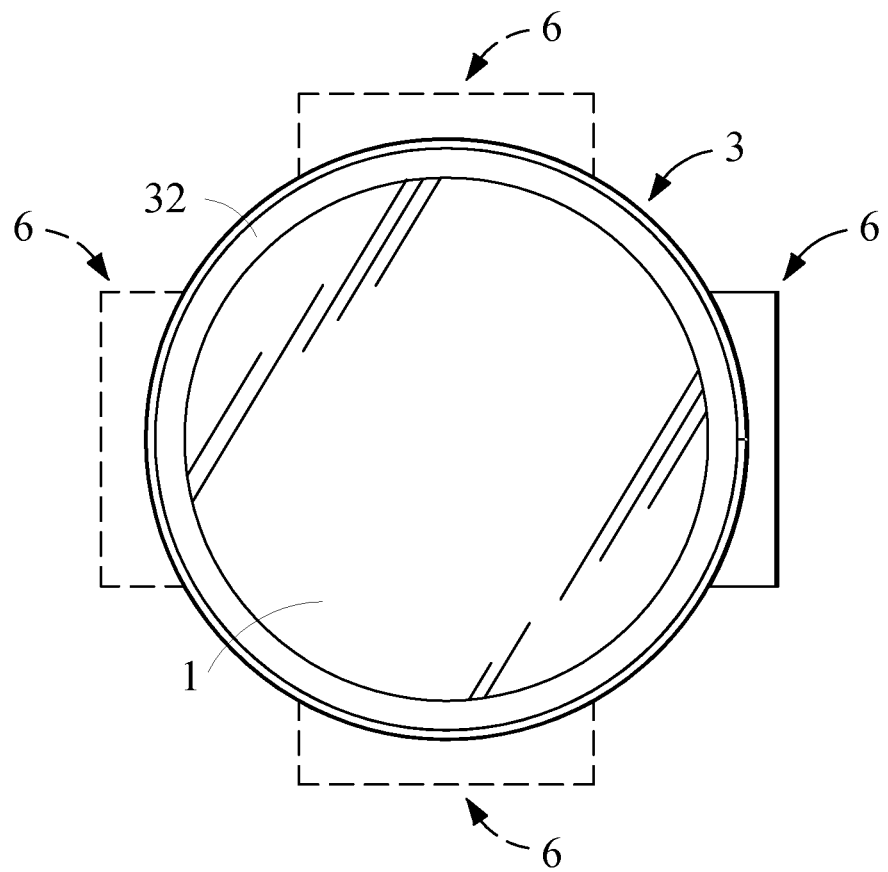
FIG. 3 is a schematic view of a mounting supporting unit according to a preferred embodiment of the present disclosure.

Referring to FIG. 1 through FIG. 3, the present disclosure provides a liquid crystal display mounting device for mounting a first liquid crystal display 1 and a second liquid crystal display 2 in place. The liquid crystal display mounting device comprises a frame 3, a first display mounting member 4, a second display mounting member 5 and a mounting supporting unit 6.

The frame 3 has a frame wiring dispensing portion 31.

The first display mounting member 4 is disposed in front of the frame 3. The first liquid crystal display 1 is disposed at the first display mounting member 4.

The second display mounting member 5 is disposed at the rear of the frame 3. The second liquid crystal display 2 is disposed at the second display mounting member 5.

The mounting supporting unit 6 comprises a first support member 61, a second support member 62 and a mounting base 63. One end of the first support member 61 is coupled to the first display mounting member 4. One end of the second support member 62 is coupled to the second display mounting member 4. The first support member 61 and the other end of the second support member 62 are coupled to the mounting base 63. The mounting base 63 has a mounting base wiring dispensing portion 64 corresponding in position to the frame wiring dispensing portion 31. A conducting wire 11 of the first liquid crystal display 1 and a conducting wire 21 of the second liquid crystal display 2 extend from the frame wiring dispensing portion 31 and the mounting base wiring dispensing portion 64 and exit the frame 3.

To start using the liquid crystal display mounting device of the present disclosure, the first liquid crystal display 1 and the second liquid crystal display 2 are mounted in place according to whether they are to be hung on a wall, hung from a ceiling, or erected. For example, when the first liquid crystal display 1 and the second liquid crystal display 2 are to be hung on a wall, the frame wiring dispensing portion 31 of the frame 3 is oriented leftward or rightward, such that the first display mounting member 4 and the second display mounting member 5 are disposed at the front and rear of the frame 3, respectively, with the first display mounting member 4 coupled to one end of the first support member 61, the second display mounting member 4 to one end of the second support member 62, aligning the mounting base wiring dispensing portion 64 of the mounting base 63 with the frame wiring dispensing portion 31, allowing the mounting base 63 to be coupled to the other end of the first support member 61 and the other end of the second support member 62, mounting the first liquid crystal display 1 and the second liquid crystal display 2 on the first display mounting member 4 and the second display mounting member 5, respectively, so as for the conducting wires 11, 21 of the first liquid crystal display 1 and the second liquid crystal display 2 to extend from the frame wiring dispensing portion 31 and the mounting base wiring dispensing portion 64 and exit the frame 3. At this point in time, the mounting base 63 is on the left (or right) of the frame 3, such that the mounting base 63 is fixed to the wall, thereby allowing the frames of the first liquid crystal display 1 and the second liquid crystal display 2 to face forward.

Furthermore, the first liquid crystal display 1 and the second liquid crystal display 2 can be hung from a ceiling or erected. To allow the first liquid crystal display 1 and the second liquid crystal display 2 to be hung from a ceiling or erected, the frame wiring dispensing portion 31 of the frame 3 faces upward or downward. The frame wiring dispensing portion 31 of the frame 3 faces upward, so as for the first liquid crystal display 1 and the second liquid crystal display 2 to be hung from a ceiling. The frame wiring dispensing portion 31 of the frame 3 faces downward, so as for the first liquid crystal display 1 and the second liquid crystal display 2 to be erected. In order for the first liquid crystal display 1 and the second liquid crystal display 2 to be hung from a ceiling or erected, the position of the frame wiring dispensing portion 31 is determined, and then the first display mounting member 4, the second display mounting member 5, the mounting supporting unit 6, the first liquid crystal display 1 and the second liquid crystal display 2 are mounted in place, thereby allowing the first liquid crystal display 1 and the second liquid crystal display 2 to be hung from a ceiling or erected.

Furthermore, the first liquid crystal display 1, the second liquid crystal display 2 and the frame 3 are round (illustrative of the present disclosure), rectangular or square as needed.

Thus, the liquid crystal display mounting device of the present disclosure is advantageous in that the locations of the frame 3, the first display mounting member 4, the second display mounting member 5 and the mounting supporting unit 6 are subject to changes, such that the first liquid crystal display 1 and the second liquid crystal display 2 can be hung on a wall, hung from a ceiling, or erected.

In an embodiment of the present disclosure, the frame 3 further comprises a cover 32. The cover 32 is disposed in front of the frame 3 and encloses the border of the first liquid crystal display 1. Thus, after the first liquid crystal display 1 and the second liquid crystal display 2 have been disposed at the first display mounting member 4 and the second display mounting member 5, respectively, the cover 32 is disposed in front of the frame 3 and encloses the border of the first liquid crystal display 1 to enhance beauty thereof and provide decoration thereto.

In an embodiment of the present disclosure, a front lamp strip 34 is disposed between the cover 32 and the frame 3. A rear lamp strip 35 is disposed at the rear of the frame 3. The front lamp strip 34 and the rear lamp strip 35 are electrically connected to the first liquid crystal display 1 and the second liquid crystal display 2, respectively. The front lamp strip 34 and the rear lamp strip 35 are LED lamp strips. Thus, in order for the first liquid crystal display 1 and the second liquid crystal display 2 to operate, it is feasible for the front lamp strip 34 and the rear lamp strip 35 to emit constantly-on light, stream-like light, flashing light, identical orange light or different orange light simultaneously or separately, so as to enhance beauty and give a prompt.

In an embodiment of the present disclosure, the first display mounting member 4 comprises a first central mounting portion 41 and two first end mounting portions 42. The first end mounting portions 42 are disposed at two ends of the first central mounting portion 41, respectively. The first end mounting portions 42 are coupled to the inner edge of the front of the frame 3. One end of the first support member 61 is coupled to the first central mounting portion 41. The first liquid crystal display 1 is coupled to the first central mounting portion 41 and the first end mounting portions 42. Thus, the first display mounting member 4 is firmly coupled to the inner edge of the front of the frame 3 through the first central mounting portion 41 and the first end mounting portions 42, thereby allowing the first liquid crystal display 1 to be firmly coupled to the first central mounting portion 41 and the first end mounting portions 42, so as to enhance the structural strength and stability of the first display mounting member 4.

In an embodiment of the present disclosure, the second display mounting member 5 comprises a second central mounting portion 51 and two second end mounting portions 52. The second end mounting portions 52 are disposed at two ends of the second central mounting portion 51, respectively. The second end mounting portions 52 are coupled to the inner edge of the rear of the frame 3. One end of the second support member 62 is coupled to the second central mounting portion 51. The second liquid crystal display 2 is coupled to the second central mounting portion 51 and the second end mounting portions 52. Thus, the second display mounting member 5 is firmly coupled to the inner edge of the rear of the frame 3 through the second central mounting portion 51 and the second end mounting portions 52, such that the second liquid crystal display 2 is firmly coupled to the second central mounting portion 51 and the second end mounting portions 52, so as to enhance the structural strength and stability of the second display mounting member 5.

In an embodiment of the present disclosure, the first support member 61 has a first connecting portion 611 and a first fitting portion 612. The first connecting portion 611 is disposed at one end of the first fitting portion 612. The first connecting portion 611 is coupled to the first central mounting portion 41 of the first display mounting member 5. The first fitting portion 612 is coupled to the mounting base 63. The second support member 62 has a second connecting portion 621 and a second fitting portion 622. The second connecting portion 621 is disposed at one end of the second fitting portion 622. The second connecting portion 621 is coupled to the second central mounting portion 51 of the second display mounting member 5. The second fitting portion 622 is coupled to the mounting base 63. Thus, the first support member 61 is firmly coupled to the first central mounting portion 41 and the mounting base 63 through the first connecting portion 611 and the first fitting portion 612, whereas the second support member 62 is firmly coupled to the second central mounting portion 51 and the mounting base 63 through the second connecting portion 621 and the second fitting portion 622, so as to not only provide auxiliary support to the first display mounting member 4 and the second display mounting member 5, respectively, but also provide the structural strength required for the mounting base 63, so as to enhance the supporting capability and stability of the mounting base 63 when the liquid crystal display mounting device of the present disclosure is hung on a wall, hung from a ceiling, or erected.

In an embodiment of the present disclosure, the mounting base 63 has a catch portion 631 and at least two fixedly connecting portions 632. The mounting base wiring dispensing portion 64 is disposed at the catch portion 631. The fixedly connecting portions 632 are disposed at two ends of the catch portion 631. The first fitting portion 612 of the first support member 61 and the second fitting portion 622 of the second support member 62 are coupled to the catch portion 631. Thus, not only does the catch portion 631 enable the first support member 61 and the second support member 62 to be firmly coupled to the mounting base 63, but the mounting base 63 also demonstrates enhanced supporting capability and stability because of the fixedly connecting portions 632 when the liquid crystal display mounting device of the present disclosure is hung on a wall, hung from a ceiling, or erected.

While the present disclosure has been described by means of specific embodiments, numerous modifications and variations could be made thereto by those skilled in the art without departing from the scope and spirit of the present disclosure set forth in the claims.

What is claimed is:

1. A liquid crystal display mounting device for mounting a first liquid crystal display and a second liquid crystal display in place, the liquid crystal display mounting device comprising:
a frame having a frame wiring dispensing portion;
a first display mounting member disposed in front of the frame, wherein the first liquid crystal display is disposed at the first display mounting member;
a second display mounting member disposed at a rear of the frame, wherein the second liquid crystal display is disposed at the second display mounting member; and
a mounting supporting unit comprising a first support member, a second support member and a mounting base, the first display mounting member being coupled to an end of the first support member, the second display mounting member being coupled to an end of the second support member, wherein another end of the first support member and another end of the second support member are coupled to the mounting base, the mounting base having a mounting base wiring dispensing portion corresponding in position to the frame wiring dispensing portion, wherein a conducting wire of the first liquid crystal display and a conducting wire of the second liquid crystal display extend from the frame wiring dispensing portion and the mounting base wiring dispensing portion and exit the frame.

2. The liquid crystal display mounting device of claim 1, wherein the frame further comprises a cover disposed at a front of the frame and enclosing a border of the first liquid crystal display.

3. The liquid crystal display mounting device of claim 2, wherein a front lamp strip is disposed between the cover and the frame, and a rear lamp strip is disposed at a rear of the frame, allowing the front lamp strip and the rear lamp strip to be electrically connected to the first liquid crystal display and the second liquid crystal display, respectively.

4. The liquid crystal display mounting device of claim 1, wherein the first display mounting member comprises a first central mounting portion and two first end mounting portions, wherein the first end mounting portions are disposed at two ends of the first central mounting portion, respectively, the first end mounting portions being coupled to an inner edge of a front of the frame, the first central mounting portion being coupled to an end of the first support member, the first liquid crystal display being coupled to the first central mounting portion and the first end mounting portions.

5. The liquid crystal display mounting device of claim 1, wherein the second display mounting member comprises a second central mounting portion and two second end mounting portions, the second end mounting portions being disposed at two ends of the second central mounting portion, respectively, the second end mounting portions being coupled to an inner edge of a rear of the frame, the second central mounting portion being coupled to an end of the second support member, the second liquid crystal display being coupled to the second central mounting portion and the second end mounting portions.

6. The liquid crystal display mounting device of claim 1, wherein the first support member has a first connecting portion and a first fitting portion, the first connecting portion being disposed at an end of the first fitting portion and coupled to the first display mounting member, the first fitting portion being coupled to the mounting base.

7. The liquid crystal display mounting device of claim 1, wherein the second support member has a second connecting portion and a second fitting portion, the second connecting portion being disposed at an end of the second fitting portion and coupled to the second display mounting member, the second fitting portion being coupled to the mounting base.

8. The liquid crystal display mounting device of claim 1, wherein the mounting base has a catch portion and at least two fixedly connecting portions, wherein the mounting base wiring dispensing portion is disposed at the catch portion, and the fixedly connecting portions are disposed at two ends of the catch portion, respectively, allowing another end of the first support member and another end of the second support member to be coupled to the catch portion.

\* \* \* \* \*